United States Patent [19]
Yu et al.

[11] Patent Number: 6,133,140
[45] Date of Patent: Oct. 17, 2000

[54] METHOD OF MANUFACTURING DUAL DAMASCENE UTILIZING ANISOTROPIC AND ISOTROPIC PROPERTIES

[75] Inventors: Allen S. Yu, Fremont; Paul J. Steffan, Elk Grove; Thomas C. Scholer, San Jose, all of Calif.

[73] Assignee: Advanced Micro Devices, Inc., Sunnyvale, Calif.

[21] Appl. No.: 09/165,782

[22] Filed: Oct. 2, 1998

[51] Int. Cl.$^7$ .................................................. H01L 21/4763
[52] U.S. Cl. ............................ 438/624; 438/638; 438/701
[58] Field of Search ...................................... 438/624, 640, 438/700, 638, 701, 673

[56] References Cited

U.S. PATENT DOCUMENTS

4,832,789  5/1989  Cochran et al. .
6,064,100  4/2000  Ramaswami et al. ................... 438/622

FOREIGN PATENT DOCUMENTS

07230968  8/1995  Japan .

*Primary Examiner*—Caridad Everhart
*Attorney, Agent, or Firm*—H. Donald Nelson

[57] ABSTRACT

A method of manufacturing a semiconductor device with dual damascene structures. A first and second layer of interlayer dielectric separated by a first layer of etch stop material is formed on the surface of a semiconductor substrate on and in which active devices have been formed. A second layer of an etch stop material is formed on the surface of the second layer of interlayer dielectric. A layer of photoresist is formed on the second layer of etch stop material and is patterned and etched to expose portions of the second etch stop material. The exposed portions of the second etch stop material are anisotropically etched exposing portions of the second layer of interlayer dielectric. The exposed portions of the second layer of interlayer dielectric are first anisotropically etched and then isotropically etched. The etch stop layer between the first and second interlayer dielectric is anisotropically etched and the first layer of interlayer dielectric is anisotropically etched. The etched portions are then filled with a conductive material.

3 Claims, 4 Drawing Sheets

METHOD OF MANUFACTURING DUAL DAMASCENE UTILIZING ANISOTROPIC AND ISOTROPIC PROPERTIES

BACKGROUND OF THE INVENTION

1. Field of the Invention

This invention relates generally to a method of manufacturing high density, high performance semiconductor devices that have dual damascene interconnects. More specifically, this invention relates to a method of manufacturing high density, high performance semiconductor devices that have dual damascene interconnects that are manufactured so that they can be filled in a single step.

2. Discussion of the Related Art

The increased demand for higher performance semiconductor devices has required the density of metallization lines to be increased and in addition has required the addition of stacked layers. These requirements have necessitated the development of novel approaches in the methods of forming interconnections that not only integrate fine geometry definition but are also conducive to subsequent CMP (chemical mechanical polishing) processing. As the interconnection line widths shrink, the challenges of etching materials using photoresist-as-mask techniques have become increasingly difficult.

Traditional methods of forming interconnection structures include the use of photoresist patterning and chemical or plasma "subtractive" etching as the primary metal-patterning technique. However, using this method, it is not possible to form a planarized layer using conventional dielectric spin-on or fill/etchback techniques for filling in the spaces between the conductive wiring. Therefore, a chemical mechanical polish (CMP) is required to form the planarized surface on which subsequent metallization structures will be built. Additional difficulties in the traditional method include the trapping of impurities or volatile materials, such as aluminum chloride, in the inter-wiring spaces, which may pose reliability risks to the device, leaving residual metal stringers, which may cause electrical shorts, residual photoresist, and poor step coverage. These problems contribute to low yields and necessitate relaxed design rules that result in low layout density.

Previous attempts to address the disadvantage of the traditional etchback methods of providing planarized interconnection structures include a single damascene technique for forming an interconnect or wire. Although the single damascene technique results in improved planarization, the technique is time consuming and requires numerous additional processing steps. In addition, an interface exists between the conductive via and conductive wire that must be dealt with elsewhere.

Another technique utilized to address the disadvantage of the traditional etchback methods is the dual damascene process. The dual danascene process is a two step sequential mask/etch process to form a two level structure such as a via connected to a metal line above the via. Current dual damascene processing technology entails depositing a triple layer sandwich consisting of a thick layer of a dielectric material, an etch stop material having a high etch selectivity to the dielectric layer, and a second thick layer of a dielectric material. The two level structure is formed by masking and etching through the top layer of dielectric material and stopping on the layer of etch stop material, etching the etch stop material only, then performing a second masking and etching process with the second mask being an oversize mask. The second etch is to the dielectric material underlying the lower layer of dielectric material. The requirement to perform a second masking and etching process is time consuming and the added processes can be the source of defects in the device being manufactured.

Therefore, what is needed is a method to manufacture a via structure/interconnect structure and a metal interconnect structure simultaneously.

SUMMARY OF THE INVENTION

According to the present invention, the foregoing and other objects and advantages are attained by a method of manufacturing a semiconductor device having dual damascene structures.

In accordance with an aspect of the invention, a first and second layer of interlayer dielectric separated by a first layer of etch stop material is formed on the surface of a semiconductor substrate on and in which active devices have been formed. A second layer of an etch stop material is formed on the surface of the second layer of interlayer dielectric. A layer of photoresist is formed on the second layer of etch stop material and is patterned and etched to expose portions of the second etch stop material. The exposed portions of the second etch stop material are anisotropically etched exposing portions of the second layer of interlayer dielectric. The exposed portions of the second layer of interlayer dielectric are first anisotropically etched and then isotropically etched. The etch stop layer between the first and second interlayer dielectric is anisotropically etched and the first layer interlayer is anisotropically etched. The etched portions are then filled with a conductive material.

In accordance with another aspect of the invention, the first layer of photoresist is removed and a second layer of photoresist is formed on the second layer of etch stop material and the first layer of interlayer dielectric not protected by the photoresist is anisotropically etched.

In accordance with another aspect of the invention, the second layer of etch stop material is removed before the etched portions are filled with a conductive material.

The described method provides an improved method of manufacturing a semiconductor device having dual damascene structures using a single mask step. The method includes steps of anisotropic and isotropic etching.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1A:
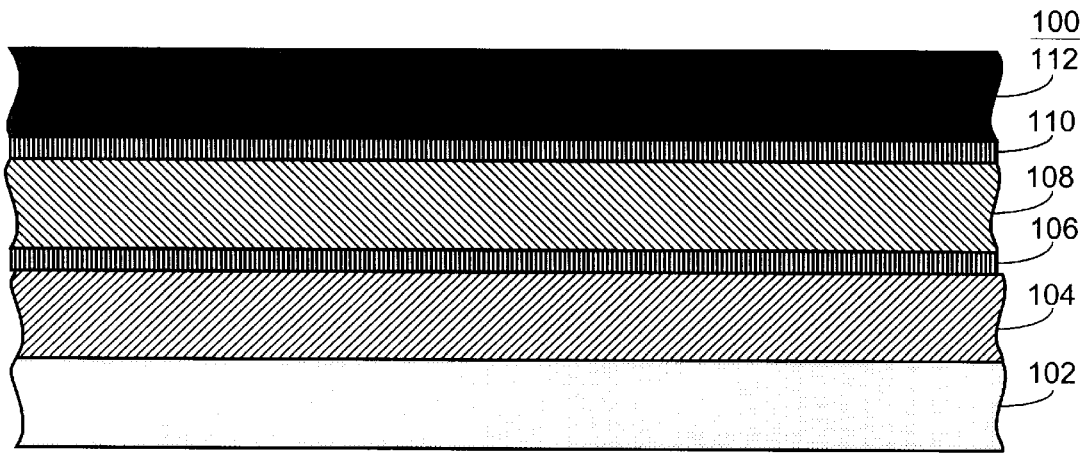
FIG. 1A shows a partially completed semiconductor device showing a substrate, two layers of interlayer dielectric separated by a layer of hard mask material and a layer of photoresist on a second layer of hard mask material.

FIG. 1A shows a partially completed semiconductor device 100. The partially completed semiconductor device 100 is formed in a semiconductor substrate on and in which active devices (not shown) are formed. The substrate and active devices are indicated generally at 102 and will not be discussed further since the methods of forming active devices in and on a semiconductor substrate are well known in the semiconductor manufacturing art and such methods of formation are not part of the present invention. A first layer 104 of interlayer dielectric is formed on the surface of the layer 102, is planarized and serves as a uniform flat surface on which to form further structures on the substrate. The initial layer of interlayer dielectric 104 is typically formed of silicon dioxide ($SiO_2$). As is known in the semiconductor art, the active devices in the layer of substrate 102 have electrodes, such as drains, sources and gates, that must be connected to electrodes of other active devices on the same level of the semiconductor devices or to electrodes of active devices on other layers of the semiconductor device. A first boundary layer or etch stop layer 106 is formed on the planarized surface. Etch stop layer 106 is typically formed of a nitride material such silicon oxynitride (SiON) or silicon nitride ($Si_3N_4$). The purpose of etch stop layer 106 is to stop a subsequent etch process that etches the second layer of interlayer dielectric 108 that is formed on etch stop layer 106. A second boundary or etch stop layer 110 is formed on the surface of the surface of the second layer of interlayer dielectric 108. Etch stop layer 110 is typically formed from a nitride material such as silicon oxynitride (SiON), silicon nitride ($Si_3N_4$) or titanium nitride (TiN). It is noted that the use of titanium nitride as the second etch stop layer 110 provides a different etch selectivity. It is also noted that titanium nitride is typically not used as the first etch stop layer 106 because it is conductive. A layer 112 of photoresist is formed on the surface of the second layer of the etch stop layer 110.

Figure 1B:
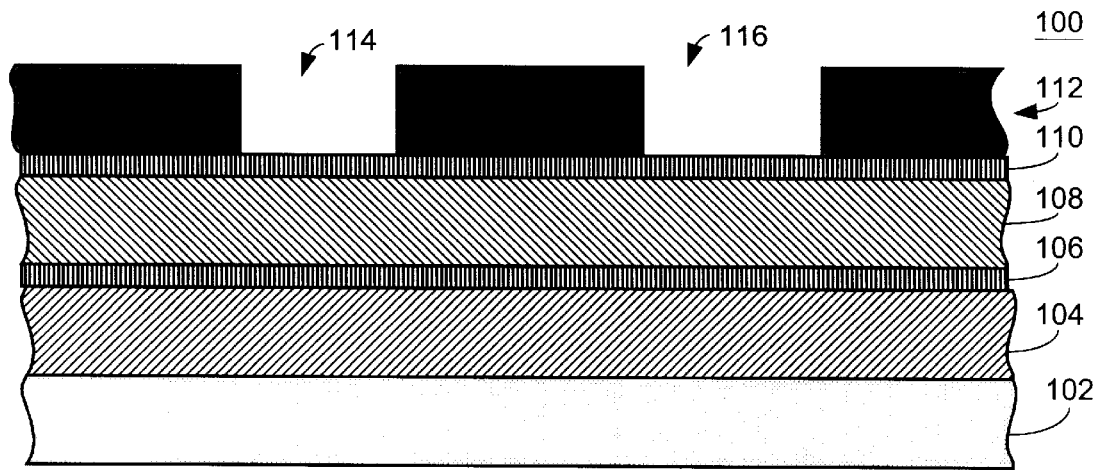
FIG. 1B shows the partially completed semiconductor device shown in FIG. 1A with the layer of photoresist patterned and etched to expose portions of the second layer of hard mask material underlying the layer of photoresist.

FIG. 1B shows the partially completed semiconductor device 100 as shown in FIG. 1A with the layer of photoresist 112 patterned and etched to form openings 114 and 116 that expose portions of the second layer of etch stop layer 110.

Figure 1C:
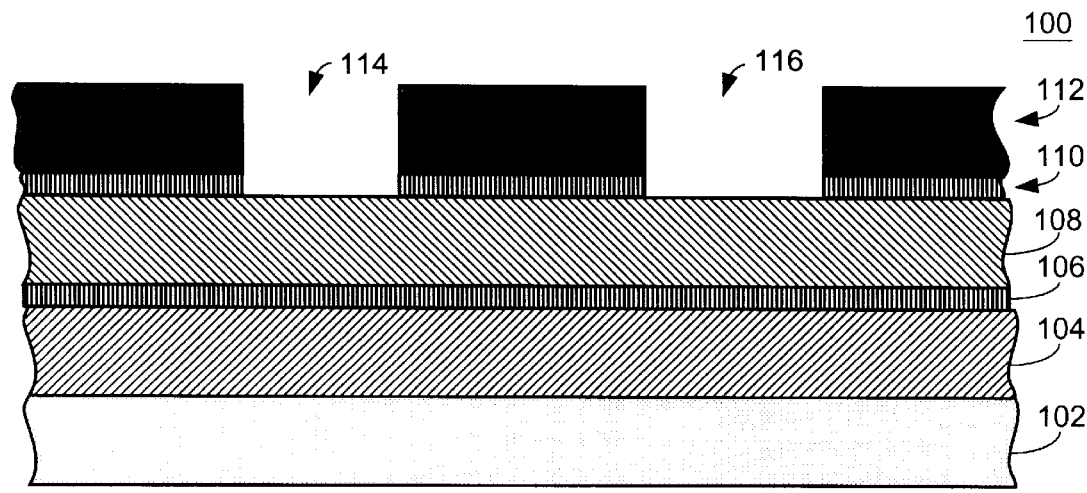
FIG. 1C shows the partially completed semiconductor device shown in FIG. 1B with the exposed portions of the second layer of hard mask etched exposing portions of the layer of interlayer dielectric underlying the second layer of hard mask material.

FIG. 1C shows the partially completed semiconductor device 100 as shown in FIG. 1B after an anisotropic etch process that etches the exposed portions of the etch stop layer 110 in the openings 114 and 116. The removal of the portions of the etch stop layer 110 in the openings 114 and 116 exposes portions of the second layer 108 of interlayer dielectric.

Figure 1D:
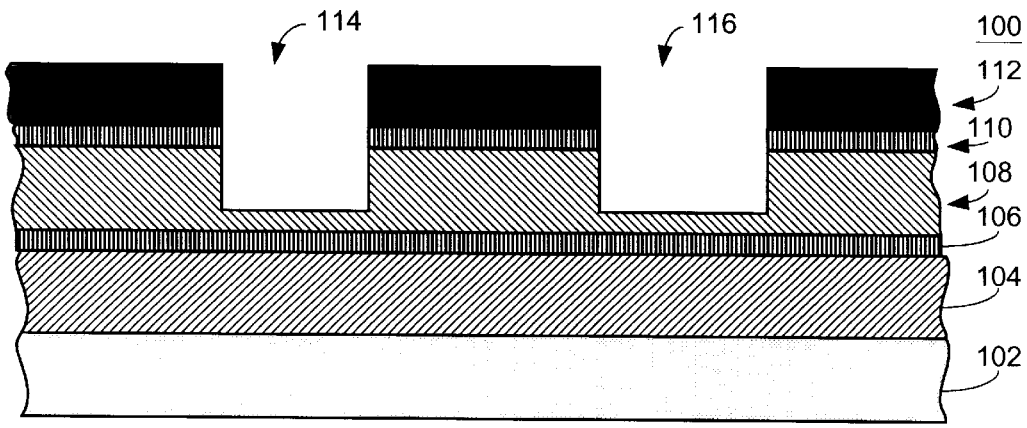
FIG. 1D shows the partially completed semiconductor device shown in FIG. 1C with the exposed portions of the layer of interlayer dielectric underlying the second layer of hard mask material partially etched.

FIG. 1D shows the partially completed semiconductor device 100 as shown in FIG. 1C after an anisotropic etch process that is timed to partially etch the second layer 108 of interlayer dielectric in the openings 114 and 116. The etch of the second layer 108 of interlayer dielectric in the openings 114 and 116 will be completed in a subsequent process. The definition of an anisotropic etch process is an etch process that proceeds exclusively in one direction, for example, only vertically.

Figure 1E:
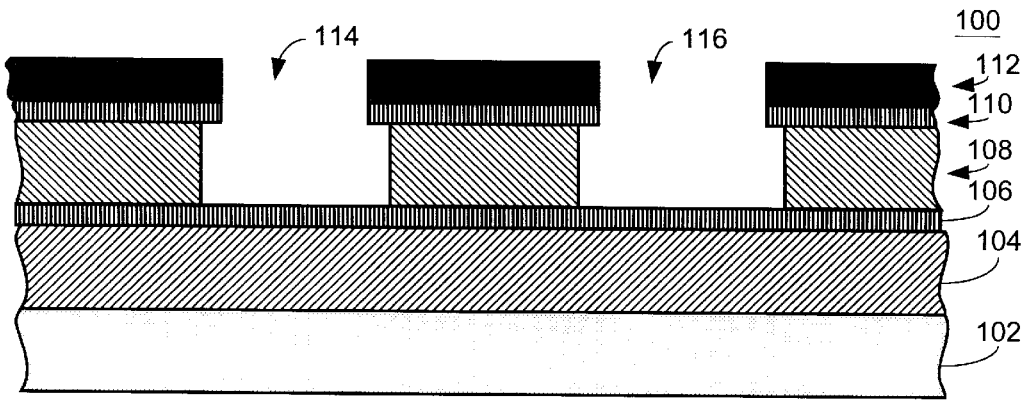
FIG. 1E shows the partially completed semiconductor device shown in FIG. 1D after an anisotropic etch process to further remove portions of the exposed portions of the layer of interlayer dielectric underlying the second layer of hard mask material exposing portions of the hard mask layer underlying the top layer of interlayer dielectric.

FIG. 1E shows the partially completed semiconductor device 100 as shown in FIG. 1D after an isotropic etch process that completes the etch of the second layer 108 that exposes portions of the first etch stop layer 106 and etches the second layer 108 interlayer dielectric sideways because of the isotropic properties of the etch. The definition of an isotropic etch process is an etch process that can proceed in all directions at the same rate.

Figure 1F:
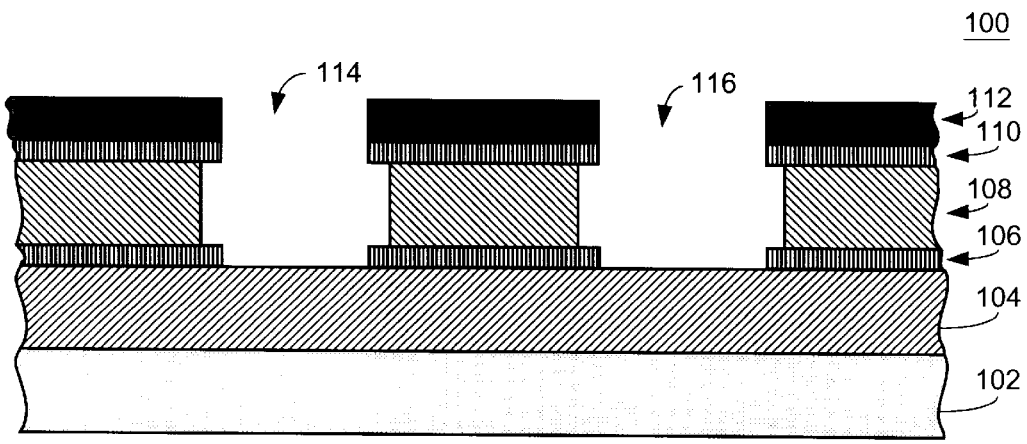
FIG. 1F shows the partially completed semiconductor device shown in FIG. 1E after an isotropic etch process to remove the exposed portions of the hard mask layer underlying the top layer of interlayer dielectric and exposing the layer of interlayer dielectric underlying hard mask layer.

FIG. 1F shows the partially completed semiconductor device 100 as shown in FIG. 1E after an anisotropic etch process that etches a portion of the exposed first etch stop layer 106. As can be appreciated, the combination of the isotropic etch process with an anisotropic etch process results in an opening having a lower portion having a first dimension and an upper portion have a second and wider dimension. The lower portion corresponds to the dimensions of a via and the upper portion corresponds to the dimensions of an interconnect. The structure having a lower portion with a first dimension and an upper portion with a second dimension is formed with only one mask and etch process sequence. The etch of the etch stop layer 106 exposes portions of the layer 104 of interlayer dielectric. The combined use of an anisotropic etch process and an isotropic etch process allows a mask step to be eliminated. This is an advantage because of the difficulties of aligning two separate masks.

Figure 1G:
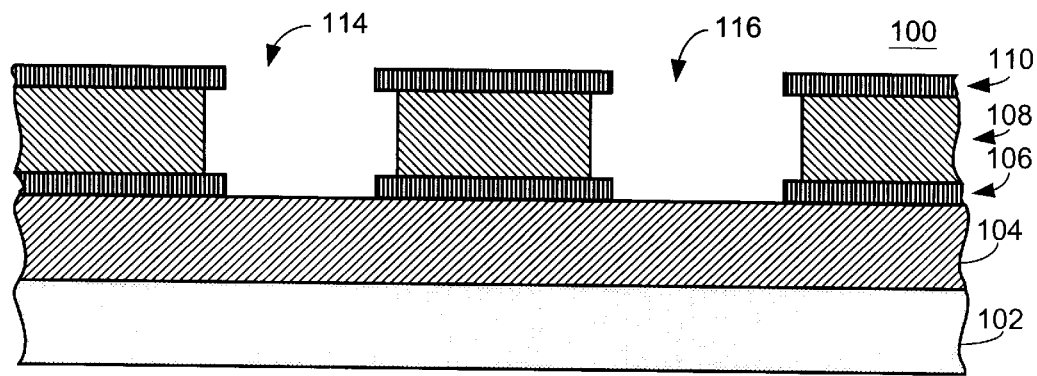
FIG. 1G shows the partially completed semiconductor device shown in FIG. 1F with the remaining portions of the layer of photoresist removed.

FIG. 1G shows the partially completed semiconductor device 100 as shown in FIG. 1F with the remaining portions of the layer 116 of photoresist removed.

Figure 1H:
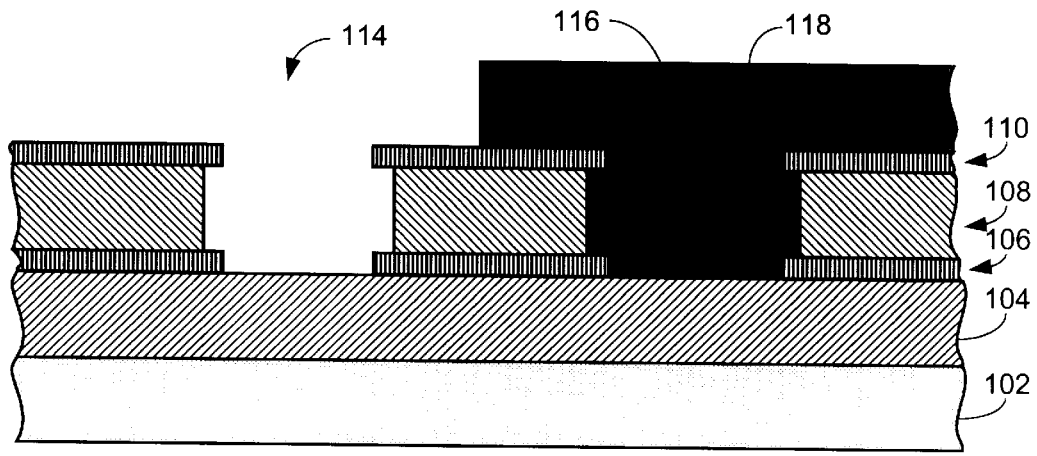
FIG. 1H shows the partially completed semiconductor device shown in FIG. 1G with a second layer of photoresist applied and patterned.

FIG. 1H shows the partially completed semiconductor device 100 as shown in FIG. 1G with a layer 118 of photoresist formed on the surface of the semiconductor device 100. The layer 118 of photoresist is shown patterned and etched. The purpose of the layer 118 of photoresist is to prevent any etch in the opening 116. Since the second etch stop layer 110 is still present to protect the surface of the second layer of interlayer dielectric 108, the alignment of the layer 118 is non-critical.

Figure 1I:
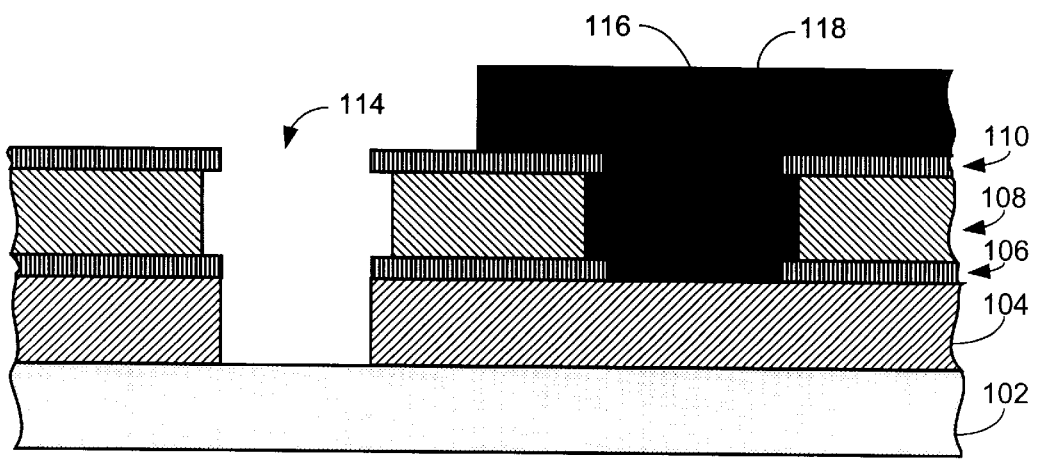
FIG. 1I shows the partially completed semiconductor device shown in FIG. 1H after an isotropic etch process to remove the exposed portions of the layer of interlayer dielectric underlying the layer of hard mask material separating the two layers of interlayer dielectric.

FIG. 1I shows the partially completed semiconductor device 100 as shown in FIG. 1H after an anisotropic etch of the exposed portions of the layer 104 of interlayer dielectric. The opening 114 extends down to the substrate 102 in which there is an electrode of an active device for which it is desired to form an electrical contact.

Figure 1J:
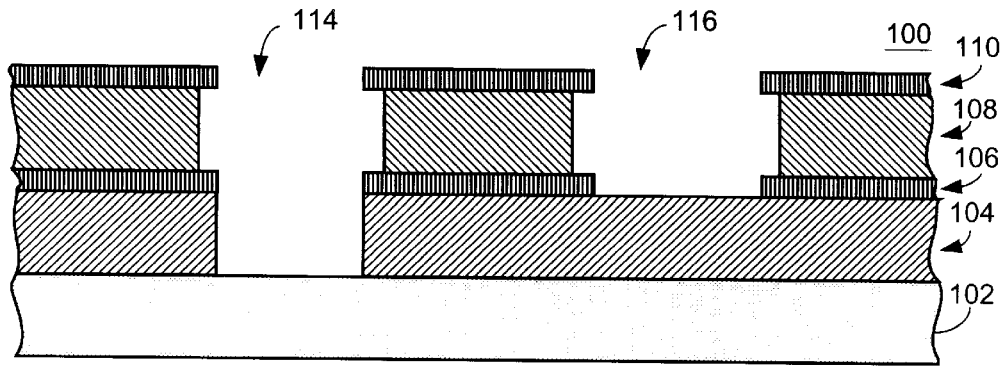
FIG. 1J shows the partially completed semiconductor device shown in FIG. 1I with the remaining layer of photoresist removed.

FIG. 1J shows the partially completed semiconductor device 100 as shown in FIG. 1I with the layer 118 of photoresist removed.

Figure 1K:
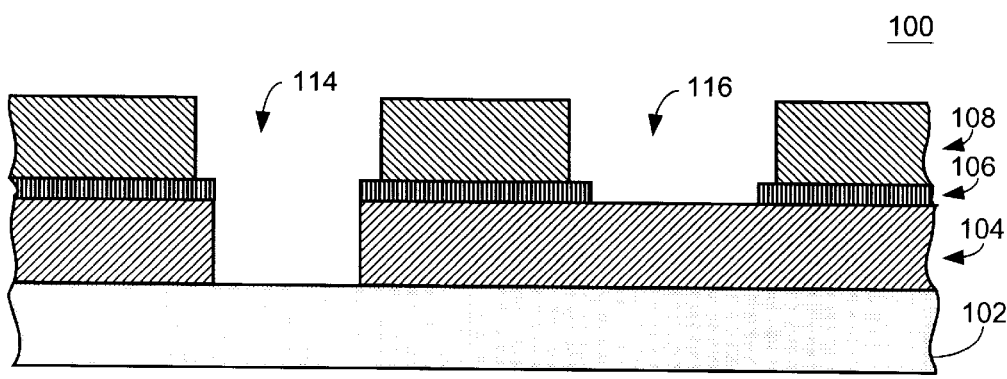
FIG. 1K shows the partially completed semiconductor device shown in FIG. 1J with the top layer of hard mask material removed.

FIG. 1K shows the partially completed semiconductor device 100 as shown in FIG. 1J with the remaining portions of the second etch stop layer 110 removed. It is noted that FIG. 1K shows the exposed portions of the first etch stop layer 106 as not being removed. This indicates that the first etch stop layer 106 is formed from a different material than the second etch stop layer 110. For example, if the first etch stop layer 106 is silicon oxynitride or silicon nitride and the second etch stop layer 110 is titanium nitride, the etch of the second etch stop layer 110 would not etch the first etch stop layer 106. Alternatively, if the second etch stop layer 110 and the first etch stop layer 106 are formed from silicon oxynitride or silicon nitride, the etch of the second etch stop layer 110 would also etch exposed portions of the first etch stop layer 106. It is also noted that an alternative to removing the second etch stop layer 110 by an etch process is to leave the second etch stop layer 110 on and remove it during a subsequent chemical mechanical polishing process. If the second etch stop layer 110 is removed it during a subsequent chemical mechanical polishing process, the second etch stop layer 110 can be used as an endpoint layer for the chemical mechanical polishing process.

Figure 1L:
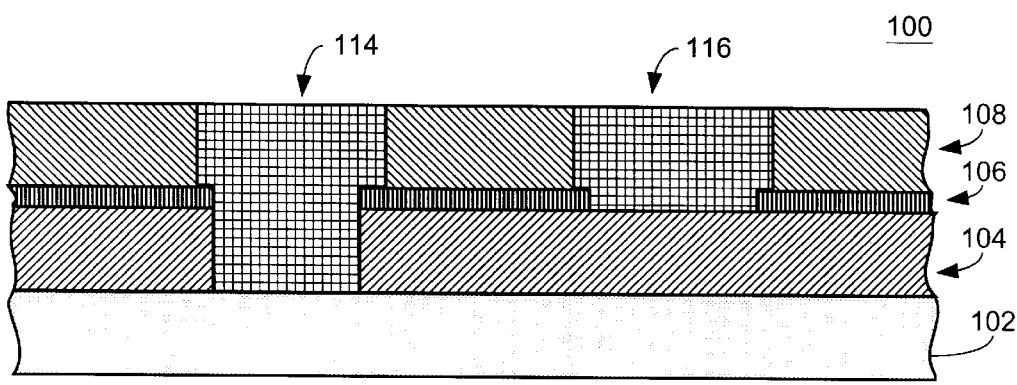
FIG. 1L shows the partially completed semiconductor device shown in FIG. 1K with the via/interconnect structure and interconnect structure filled with a conductive material.

FIG. 1L shows the partially completed semiconductor device 100 as shown in FIG. 1K with the openings 114 and 116 filled with a conductive material such as aluminum, tungsten, copper or doped polysilicon. As is known in the semiconductor art, a layer of the conductive material is formed on the surface of the semiconductor device so that it flows into the openings and the excess is removed by a polishing operation such as a chemical mechanical planarization.

In summary, the results and advantages of the method of the present invention can now be more fully realized. The method of the present invention provides a semiconductor device having multiple dual damascene structures that are formed with a single mask step and the via portion and the trench portion can be filled simultaneously.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:

forming a first layer of interlayer dielectric on a surface of a semiconductor substrate that contains active semiconductor devices;

forming a first layer of an etch stop material on the first layer of interlayer dielectric;

forming a second layer of interlayer dielectric on a surface of the first etch stop material;

forming a second layer of an etch stop material on a surface of the second layer of interlayer dielectric;

forming a first layer of photoresist on a surface of the second layer of interlayer dielectric;

patterning and etching the first layer of photoresist exposing portions of the second layer of etch stop material under which conductive wires and conductive vias are to be formed;

anisotropically etching the exposed portions of the second layer of etch stop material exposing portions of the second layer of interlayer dielectric;

anisotropically etching the exposed portions of the second layer of interlayer dielectric; isotropically etching the exposed portions of the second layer of interlayer dielectric exposing portions of the first layer of etch stop material;

anisotropically etching the exposed portions of the first layer of etch stop material exposing portions of the first interlayer dielectric;

removing the first layer of photoresist;

forming a second layer of photoresist on the semiconductor device;

removing portions of the second layer of photoresist under which vias in the first layer of interlayer dielectric are to be formed; and anisotropically etching the exposed portions of the first interlayer dielectric.

2. The method of claim 1 further comprising removing the second layer of etch stop material and filling etched portions of the first and second layers of interlayer dielectric and the etched portions of the first and second layers of etch stop material with a conductive material.

3. The method of claim 2 further comprising a chemical mechanical polishing process to planarize the conductive material down to a surface of the second layer of interlayer dielectric.

* * * * *